(12) United States Patent
Dybdal et al.

(10) Patent No.: US 7,965,228 B2
(45) Date of Patent: Jun. 21, 2011

(54) QUASI-COMPACT RANGE

(75) Inventors: Robert B. Dybdal, Palos Verdes Estates, CA (US); David A. Thompson, El Segundo, CA (US); Frank A. Pisano, III, Manhattan Beach, CA (US)

(73) Assignee: The Aerospace Corporation, El Segundo, CA (US)

( * ) Notice: Subject to any disclaimer, the term of this patent is extended or adjusted under 35 U.S.C. 154(b) by 653 days.

(21) Appl. No.: 11/935,235

(22) Filed: Nov. 5, 2007

(65) Prior Publication Data

US 2010/0039332 A1 Feb. 18, 2010

(51) Int. Cl.
*G01S 7/40* (2006.01)
*G01S 13/00* (2006.01)

(52) U.S. Cl. ......... 342/173; 342/165; 342/174; 342/175

(58) Field of Classification Search .......... 342/165–175, 342/195, 368–377, 1–11; 343/700 R, 703, 343/757–766, 832, 834–840, 907, 912–916
See application file for complete search history.

(56) References Cited

U.S. PATENT DOCUMENTS

| | | | | | |
|---|---|---|---|---|---|
| 2,479,565 | A | * | 8/1949 | Grossman | 342/165 |
| 2,489,075 | A | * | 11/1949 | Bishop | 342/165 |
| 2,510,299 | A | * | 6/1950 | Schramm | 342/165 |
| 2,537,139 | A | * | 1/1951 | Kannenberg et al. | 342/165 |
| 2,656,533 | A | * | 10/1953 | London et al. | 342/173 |
| 2,665,420 | A | * | 1/1954 | Winterhalter | 342/165 |
| 2,942,257 | A | * | 6/1960 | Huntington | 342/165 |
| 2,961,654 | A | * | 11/1960 | Simon | 342/165 |
| 3,149,284 | A | * | 9/1964 | Kishinsky | 342/165 |
| 3,153,760 | A | * | 10/1964 | Henderson | 343/703 |
| 3,302,205 | A | * | 1/1967 | Johnson | 343/703 |
| 3,357,014 | A | * | 12/1967 | Atlas | 342/174 |
| 4,283,725 | A | * | 8/1981 | Chisholm | 342/174 |
| H514 | H | | 8/1988 | Burnside et al. | |
| 4,800,387 | A | * | 1/1989 | Joy | 342/165 |
| 4,884,078 | A | * | 11/1989 | Fishkin et al. | 342/174 |
| 5,007,721 | A | * | 4/1991 | Morris et al. | 342/6 |
| 5,485,158 | A | * | 1/1996 | Mailloux et al. | 342/165 |
| 5,534,873 | A | * | 7/1996 | Weichman et al. | 342/165 |
| 5,819,164 | A | * | 10/1998 | Sun et al. | 342/6 |
| 5,910,787 | A | * | 6/1999 | Berg et al. | 342/165 |
| 5,936,568 | A | * | 8/1999 | Berg et al. | 342/1 |
| 6,008,753 | A | | 12/1999 | Berg et al. | |
| 6,335,705 | B1 | * | 1/2002 | Grace et al. | 343/703 |

(Continued)

OTHER PUBLICATIONS

J. R. Mentzer, "The Use of Dielectric Lenses in Reflection Measurements," Proc IRE 41, pp. 252-256, Feb. 1953.

(Continued)

*Primary Examiner* — Bernarr E Gregory
(74) *Attorney, Agent, or Firm* — Henricks, Slavin & Holmes LLP

(57) ABSTRACT

An antenna method and system to implement a quasi-compact range technique/technology in which a reflector antenna is used to produce a test field within a test region at a quasi-compact range, which is within a near-field of the reflector antenna but further from the reflector antenna than a compact range of the reflector antenna.

22 Claims, 5 Drawing Sheets

U.S. PATENT DOCUMENTS

| | | | | |
|---|---|---|---|---|
| 6,469,658 | B2 * | 10/2002 | Courtney et al. | 342/169 |
| 6,639,548 | B2 * | 10/2003 | Courtney et al. | 342/169 |
| 6,771,216 | B2 * | 8/2004 | Patel et al. | 342/368 |
| 6,778,131 | B2 * | 8/2004 | Haney et al. | 342/174 |
| 7,046,191 | B2 * | 5/2006 | Tokutsu et al. | 342/165 |
| 7,119,739 | B1 * | 10/2006 | Struckman | 342/174 |
| 7,154,435 | B2 * | 12/2006 | Morgan et al. | 342/165 |
| 7,365,677 | B2 * | 4/2008 | Tsunoda | 342/165 |
| 7,688,246 | B2 * | 3/2010 | Hirata et al. | 342/1 |
| 2006/0055592 | A1 * | 3/2006 | Leather et al. | 342/174 |

OTHER PUBLICATIONS

T. H. Lee and W. D. Burnside, "Performance Trade-off Between Serrated Edge and Blended Rolled Edge Compact Range Reflectors," IEEE Trans Ant Prop AP-44, pp. 87-96, Jan. 1996.

R. B. Dybdal and G. E. Stewart, "Development of a Small Compact Range Facility," 1988 AMTA Symposium Digest, Atlanta GA, pp. 10-19-10-22, Sep. 12-16, 1998.

* cited by examiner

QUASI-COMPACT RANGE

STATEMENT OF GOVERNMENT INTEREST

The invention was made with Government support under contract number FA8802-04-C-0001 awarded by the Department of the Air Force. The Government has certain rights in the invention.

TECHNICAL FIELD

The invention relates generally to antennas and, in particular, to using a reflector antenna to produce a test field at a quasi-compact range.

BACKGROUND ART

The far-field pattern of an antenna is its response to uniform plane-wave illumination at various incident angles. Three distinct approaches exist for measuring an antenna's pattern. The oldest approach is to illuminate the antenna with a distant source. However, a high gain antenna requires an excessive separation from the source. A second approach, referred to as near-field sampling, measures the field amplitude and phase distribution within the near field of the antenna and mathematically transforms these measurements to obtain a far field pattern. This approach requires accurate positioning of a probe and limits the angular range of the calculated patterns. The third approach, referred to as a compact range, uses the collimated near-field close to the aperture of a large offset reflector or lens as a test field. This approach requires a larger compact range antenna than that being tested and design attention to scattering components that can degrade measurement accuracy.

It would be helpful to be able to provide an antenna range design that produces test fields having sufficient uniformity for antenna testing, using the near field of a conventional reflector antenna. It would be helpful if such an antenna range design also limits multipath degradation, as well as provides high measurement sensitivity.

SUMMARY OF THE INVENTION

Conventional compact ranges use a reflector antenna's near field to produce the plane wave illumination needed to measure a second antenna under test (AUT). The quasi-compact range technique described herein uses a conventional reflector antenna at a greater range separation than conventional compact ranges, but still within the reflector's near field. Its illumination allows antenna evaluations at smaller range separations than the AUT's far-field distance and allows modification of a current far-field range with a reflector range antenna to measure larger test articles than normally acceptable.

The quasi-compact range technique preserves many advantages of a standard compact range including reduced multipath and high measurement sensitivity that result from the collimated near field of the illuminating reflector antenna. Additionally, in an example embodiment, a conventional reflector antenna is used without requiring edge treatments to reduce diffraction effects that would distort the desired uniform test fields illuminating the test article.

The near field of a conventional reflector antenna has been examined to determine the region over which the field is sufficiently uniform to illuminate a second antenna for test purposes. Simulations indicate that a range length longer than that found in a conventional compact range provides an adequate test zone illumination. Furthermore, it has been observed that the test field uniformity can be improved by defocusing the reflector's feed slightly.

Experience with a four-foot prime focus parabola operating at 18 GHz illustrates this technique. The measured quiet zone fields compare favorably with calculated values using the GRASP (Gravitational Radiation Analysis and Simulation Package) codes. Likewise, measurements of a 20"-diameter offset reflector antenna compare favorably with GRASP results.

In an example embodiment, the quasi-compact range technique described herein uses a conventional reflector antenna to illuminate the antenna under test. A distinction between this design and the conventional compact range is that the test zone is much farther from the compact range antenna than in a standard compact range.

The quasi-compact range separation is large enough to allow the use of a conventional axially fed reflector rather than an offset reflector or lens. Any scattering by the feed or diffraction from reflector edges of this conventional reflector antenna is sufficiently attenuated by the separation to avoid measurement degradation. In an example embodiment, the uniformity of the test field is further increased by defocusing the antenna feed.

The fields outside the test region decrease rapidly with distance from the test field. This property has two advantages over far-field antenna ranges. First, reflections from the surrounding facility are reduced because the facility is not illuminated. The typical (conventional) approach to reducing reflections involves covering the facility walls with microwave absorber, which is expensive. In contrast, the roll-off of field strength provided by the quasi-compact range significantly reduces facility reflections and therefore requirements for microwave absorber. The second advantage is increased measurement sensitivity because the near-field amplitudes do not spherically spread the power density in the same way as a far-field range. Thus, if a given level of transmitter power is used for measurement, a higher power density is provided in the test region in comparison to far-field ranges.

In an example embodiment, an antenna method includes using a reflector antenna to produce a test field within a test region at a quasi-compact range, which is within a near-field of the reflector antenna but further from an aperture plane of the reflector antenna than a compact range of the reflector antenna.

In an example embodiment, an antenna method includes determining a quiet zone within a near-field of a reflector antenna and further away from the reflector antenna than a compact range of the reflector antenna in which a test field generated by the reflector antenna is substantially uniform and, positioning a test object within the quiet zone, and using the reflector antenna to measure the test object.

In an example embodiment, an antenna system includes a reflector antenna configured to generate a test field within a test region at a quasi-compact range which is within a near-field of the reflector antenna and further away from the reflector antenna than a compact range of the reflector antenna.

DISCLOSURE OF INVENTION

This measurement technique described herein offers the ability to use conventional reflector antennas available from a variety of vendors to produce test fields for antenna measurements, as well as for measuring radar targets. The reduced range and the reduced facility interactions and increased measurement sensitivity afforded by the pattern roll-off afford opportunities to configure cost effective measurement capabilities.

Figure 1:
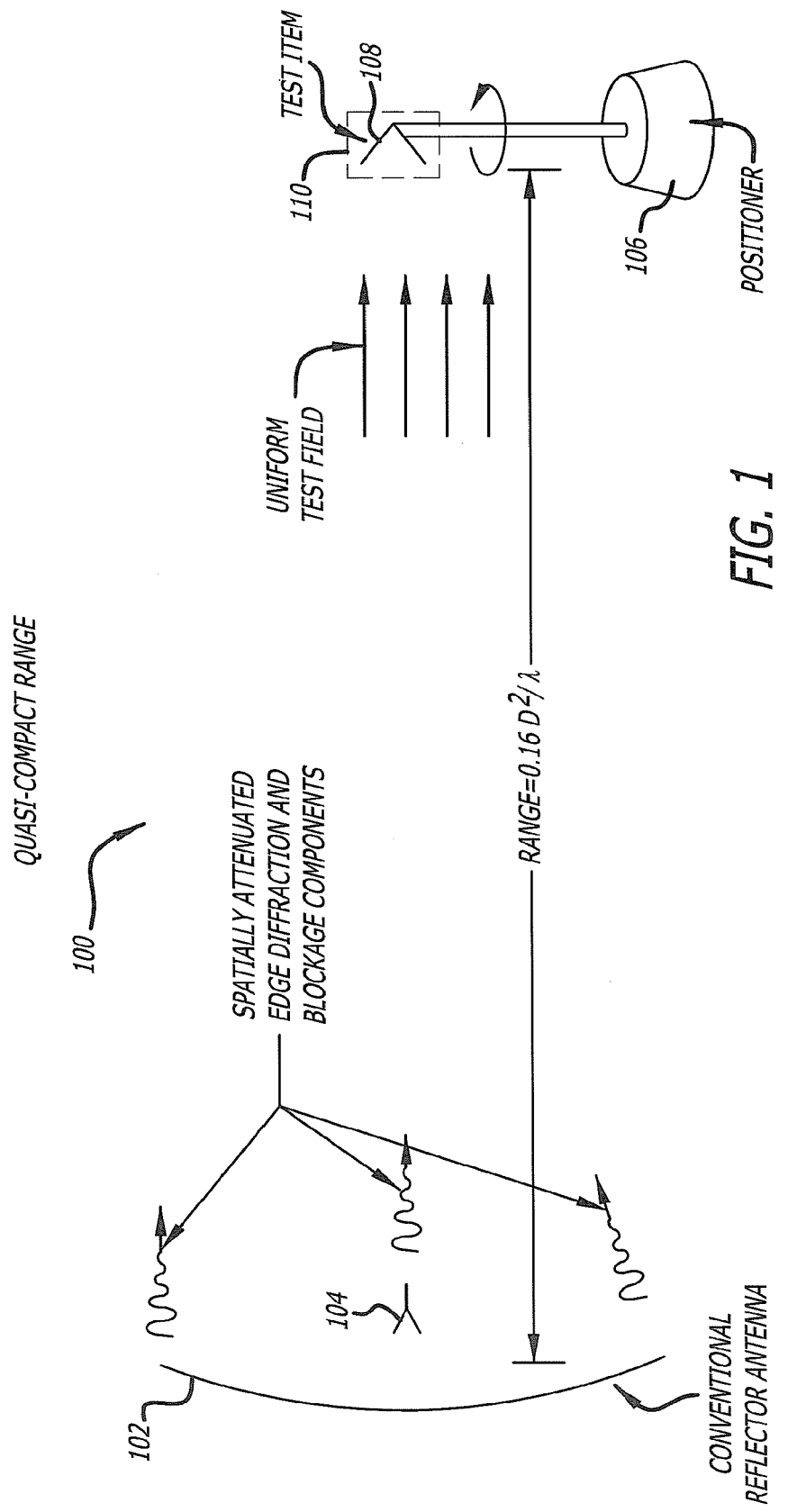
FIG. 1 illustrates a reflector antenna system used in quasi-compact range, according to an example embodiment of the present invention.

FIG. 1 illustrates a reflector antenna system 100 used in quasi-compact range, according to an example embodiment of the present invention. In this example embodiment, the reflector antenna system 100 includes a reflector antenna 102 including a horn 104. In an example embodiment, the horn 104 is configured to provide an amplitude symmetry pattern (e.g., by selectively shaving the outside of a waveguide). A positioner 106 (which, in conventional fashion includes, for example, a stepper motor and controller) is configured to control positioning of a test item (article to be measured) 108 within a test region 110 (shown in dashed lines). In this example embodiment, the quasi-compact range is approximately $0.16\, D^2/\lambda$, wherein D is the diameter of the reflector antenna, and $\lambda$ is the wavelength of a signal source provided to the reflector antenna 102. By contrast, a conventional far field range requires a $2\, D^2/\lambda$ separation between the illuminator and test object.

Figure 2:
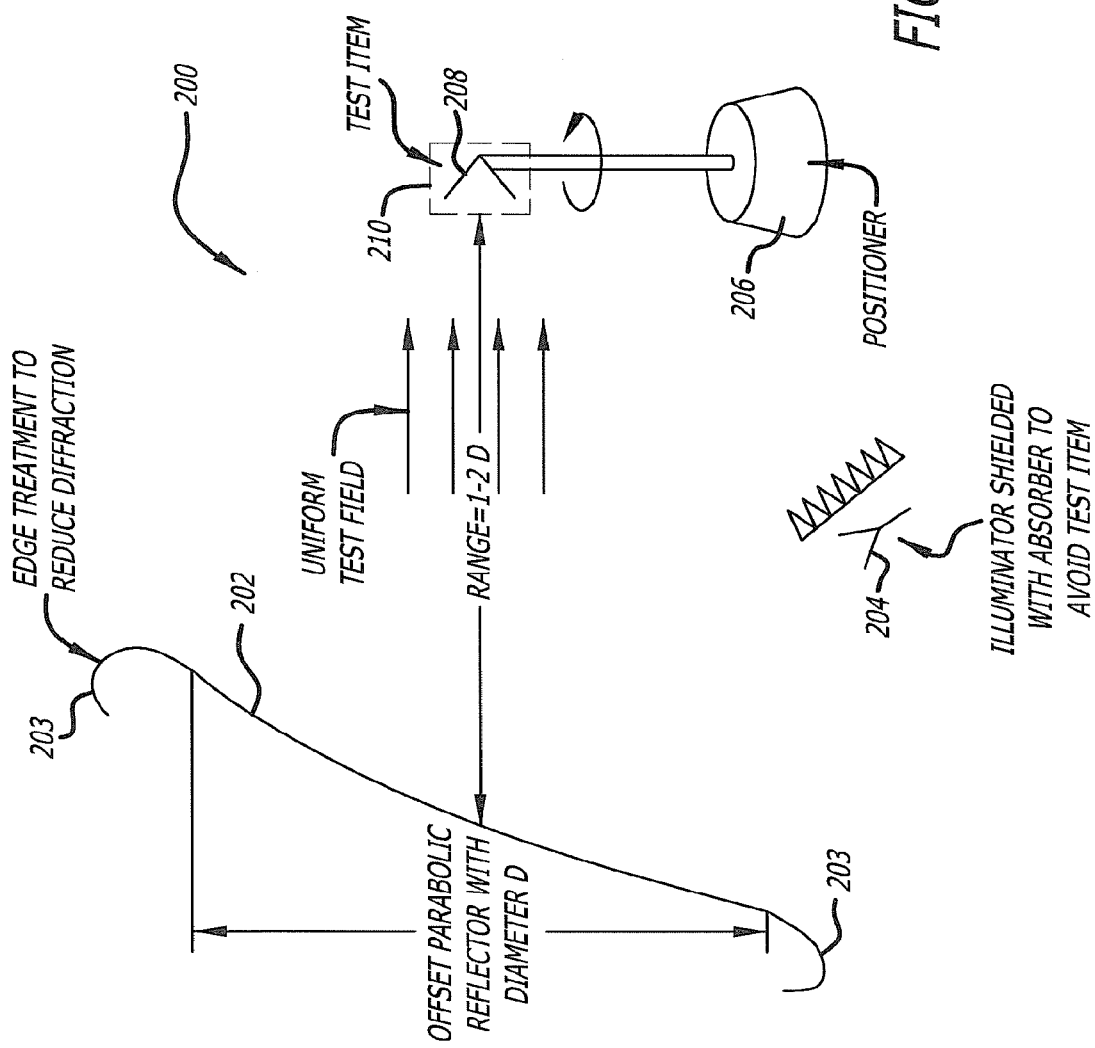
FIG. 2 illustrates a conventional compact range using an offset parabolic reflector system.

Referring to FIG. 2, by way of comparison, a conventional offset parabolic reflector system 200 includes an offset parabolic reflector 202 with edge treatments 203 to reduce diffraction, and an illuminator 204 shielded with an absorber. A positioner 206 (which, in conventional fashion includes, for example, a stepper motor and controller) is configured to control positioning of a test item (article to be measured) 208 within a test region 210 (shown in dashed lines). The compact range is approximately 1-2 D, wherein D is the diameter of the offset parabolic reflector 202.

Referring again to FIG. 1, in an example embodiment, a quasi-compact range technique is used for antenna measurements and uses the near-field of a conventional prime-focus reflector to produce a plane wave for measuring a second antenna under test (AUT). The technique permits range lengths shorter than the far-field distance of the AUT and allows modification of an existing far-field range with a reflector range antenna to measure larger test articles than normally acceptable.

Quasi-compact range differs from a conventional compact range in that the separation distance between the reflector and the AUT is much greater for the quasi-compact range. Because quasi-compact range is illuminated by a conventional reflector antenna, the additional range separation is required to provide sufficient spherical reduction of the blockage fields in comparison to the collimated near fields of the illuminating reflector antenna. Although this could be viewed as a disadvantage, the longer range length of the quasi-compact range is beneficial. Unlike a standard compact range that uses an offset reflector geometry and edge treatments to control diffraction degradation of the quiet zone fields (FIG. 2), quasi-compact range uses a conventional reflector antenna geometry having a reduced implementation cost. In common with conventional compact ranges, reduced susceptibility to facility multipath components results from the collimated near field as well as high measurement sensitivity and consequently measurement dynamic range that results from high quiet zone field densities in comparison to the power transmitted by the illuminator. One limitation of this quasi-compact range technique, however, is the bandwidth over which the quiet zone fields can be maintained as will be illustrated.

The advantages of the quasi-compact range technique described herein compared to far-field ranges include:

Reduced antenna range length caused by the planarity of the near-field distribution Decreased facility interaction due to sharp field roll-off away from the test region Increased measurement sensitivity (dynamic range) afforded by the confined near-field distribution.

Range design and quiet zone characteristics have been observed both experimentally and analytically. Measured results for a 20 inch diameter offset reflector antenna were also compared with analytic results predicted by GRASP.

Range Design and Near-Field Simulations

An example of the quasi-compact range was designed to work at 18 GHz and was used on an existing outdoor far-field range that is limited to a 65 ft separation between the AUT and the range illuminator. A four-foot diameter, sixteen-inch focal length, prime-focus reflector is the quasi-compact range illumination that is required to produce a 20 inch quiet zone. This quiet zone is achieved 47 ft from the reflector. A conventional far-field range would require a separation distance of 102 ft to produce this quiet zone requirement.

The near field of this quasi-compact range's reflector was simulated with GRASP, a commercially available physical optics program. A rolled edge horn was used as a feed for this reflector and its illumination of the quasi-compact range reflector closely follows a Gaussian feed pattern. One design parameter to be determined was an appropriate edge illumination taper and this taper was derived through the GRASP analyses. The blockage of this prime focus feed is also included in the near field analyses.

The near field variations of the quasi-compact range reflector were examined at various range separations up to the 65-foot maximum range separation permitted by the testing facility. The goal was to find a 20 inch quiet zone with less that 1 dB of amplitude variation and 22° of phase variation. This amplitude change is comparable to a conventional compact range's quiet zone; the phase variation is what one would expect on a far-field range at the minimum far-field distance. These analyses determined that a 9 dB feed amplitude edge taper and 45.7-foot range separation produced an acceptable quiet zone. A circular open-ended waveguide was then fabricated to produce the design edge amplitude taper; different wall thicknesses were used to maintain the taper in both planes. The 45.7-foot separation corresponds to 8% of the far field distance of the 4 ft quasi-compact range reflector and 45% of the standard far-field distance for the 20 inch diameter reflector to be measured.

Figure 3:
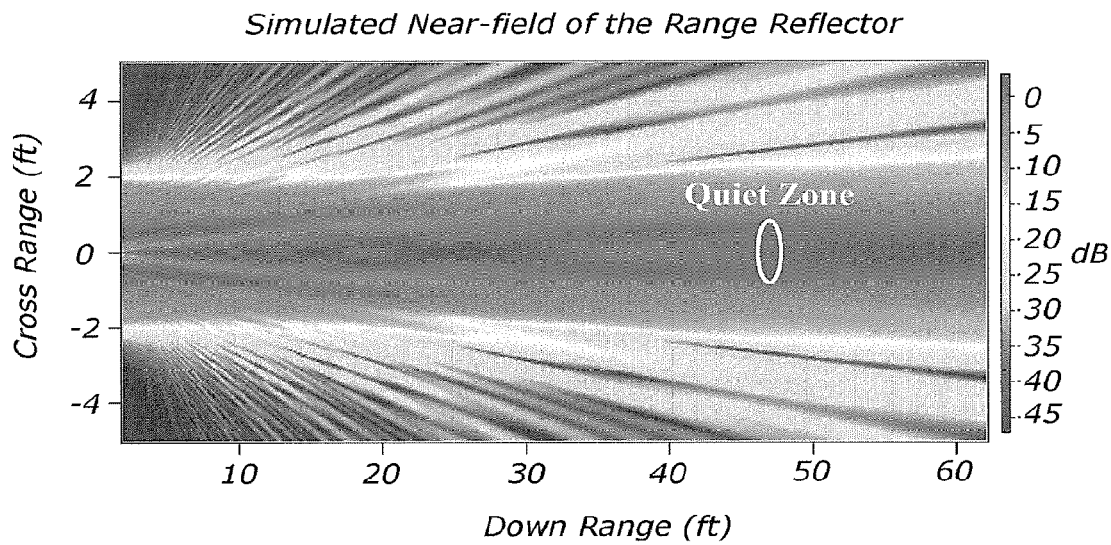
FIG. 3 shows a simulated near-field of the range reflector according to an example embodiment of the present invention.

The near field variations of the quasi-compact range predicted by GRASP are depicted in FIG. 3. Down range lies along the horizontal axis, and cross-range spans the vertical axis. The vertex of the range reflector resides at a down range and cross-range coordinate of (0,0). The figure shows that the fields remain confined to the center portion of the range (±2 ft cross range) and die off quickly for larger cross range values. This behavior isolated the quiet zone (test region) from facility reflections and provides for a high measurement dynamic range.

Figure 4:
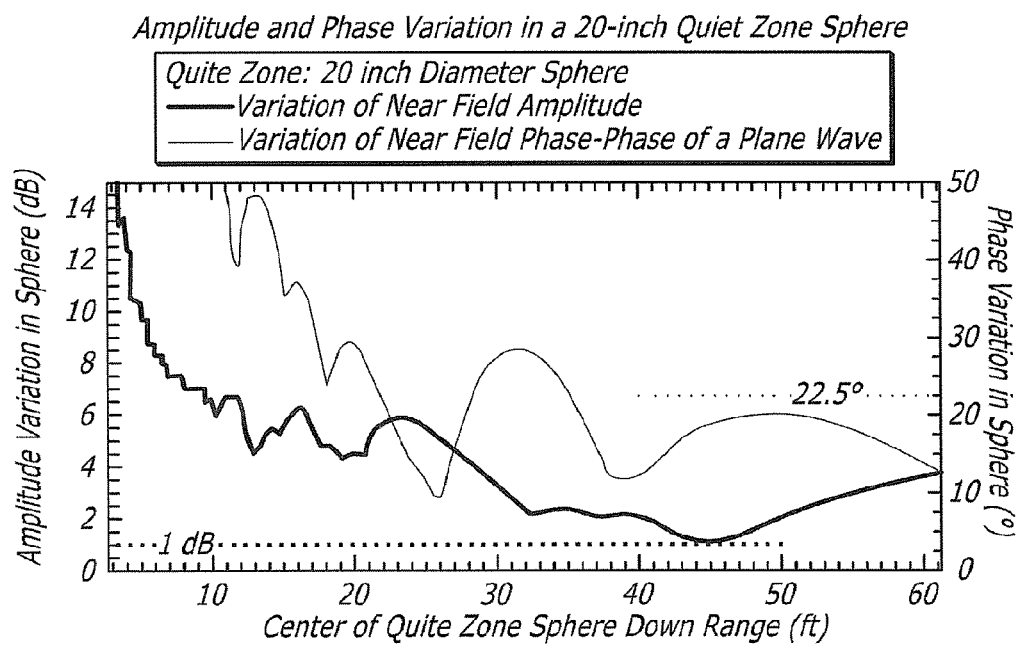
FIG. 4 is a plot that shows amplitude and phase variation in a 20-inch quiet zone sphere.

The peak-to-peak amplitude ripple shown in FIG. 4 was determined within a 20 inch diameter sphere centered at various range separations down range from the reflector center. Within this same volume, the difference between the phase of the near-field and the expected phase of a plane wave traveling down range was also determined. The data plots in FIGS. 3 and 4 indicate that blockage and edge effects cause a significant amount of ripple close to the reflector. The ripple stays above 4 dB all the way out to 28 feet down range. This behavior can be predicted by applying forward scattering theory to the blockage contributions. The desired quiet zone location can be seen to be at 45.7 feet down range. The field ripple in the sphere is 0.95 dB and the phase variation is 20°.

Figure 5:
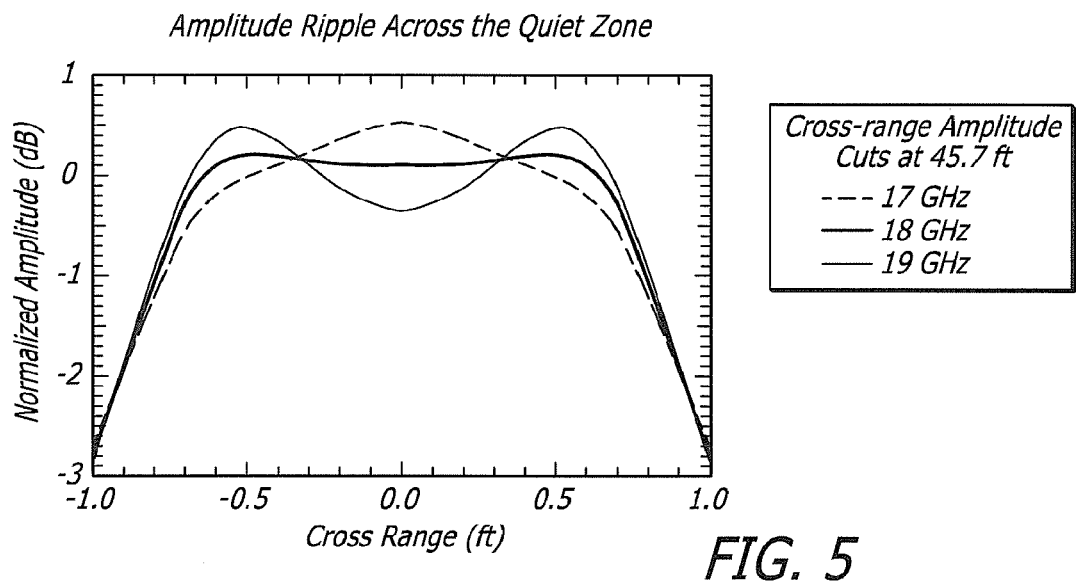
FIG. 5 is a plot that shows amplitude ripple across the quiet zone.

The frequency dependence of the quiet zone variations were addressed by calculating the amplitude ripple across the quiet zone at 17, 18, and 19 GHz as shown in FIG. 5. The amplitude is very flat at 18 GHz. However, the ripple increases as the frequency deviates from its design value. For this particular example, the peak-to-peak ripple has gone from 0.2 dB at 18 GHz to 1 dB at the other frequencies. Within the quiet zone sphere, the 17 and 19 GHz amplitude variation was found to be 3.4 dB. Further, the location of quiet zone with minimal ripple shifted from the 18 GHz case by −2.5 feet at 17 GHz and by +2.5 feet at 19 GHz. Also, the minimum ripple for these two frequencies was determined to be 3 dB. These quiet zone changes with frequency illustrate the useful bandwidth limitations of an example quasi-compact range design.

Figure 6:
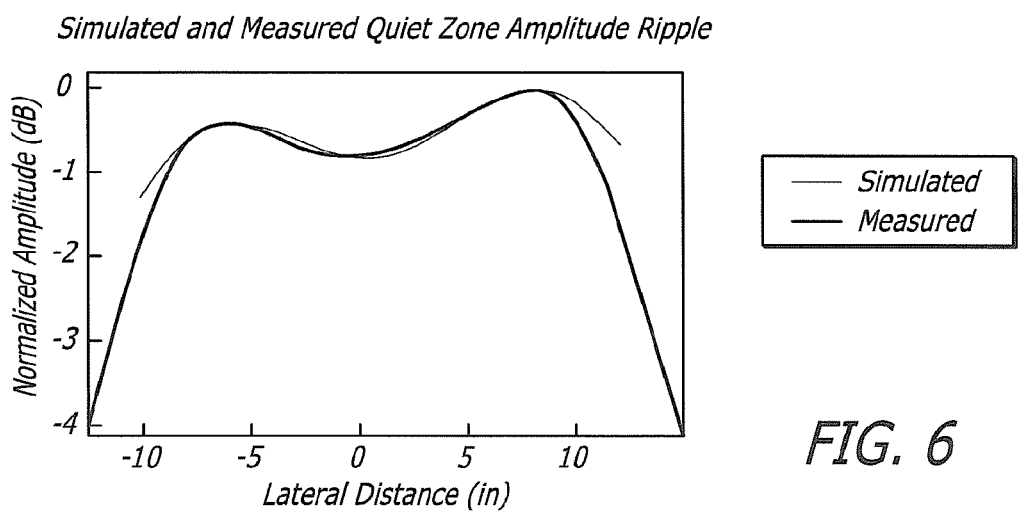
FIG. 6 is a plot that shows simulated and measured quiet zone amplitude ripple.

Based on these simulations, measurements of the quiet zone characteristics were performed. These measurements were conducted at the 47 ft separation identified in the analyses. The quasi-compact range reflector used in this investigation resulted in a feed position somewhat removed from the reflector focus. This feed displacement results in a minor asymmetry in the amplitude variation in the quiet zone. The measurements and analysis including the feed displacement in FIG. 6 have good agreement. The amplitude ripple is 1.2 dB across the 20-inch zone and the measured phase variation is 12°.

As noted above, the quasi-compact range technique described herein has been investigated both analytically and experimentally. Specifically, a four-foot reflector antenna was analyzed at a frequency of 18 GHz. The typical far field distance for this antenna is about 585 ft. Investigation using GRASP computer code revealed that a distance of 47 ft, roughly 8% of the far field distance, produced a test region having a cross section of 2 ft. An axially feed 4 ft reflector antenna was then measured at this range to validate the analyses. The measured and calculated field distributions were compared in FIG. 6. Analyses indicate a slight defocusing of the feed increases the uniformity of the test fields. This defocusing was used in the data in FIG. 6.

Example Measurements

A 20-inch offset reflector was the AUT used to evaluate the quasi-compact range. During this evaluation, a rolled edge feed was used for the AUT. The 20-inch offset reflector antenna was somewhat larger than the quiet zone. The projected circular aperture is 20 inches; it measures 25.5 inches from top to bottom edge. When the AUT is rotated in the quiet zone to measure its pattern, limited portions of the reflector can extend beyond the quiet zone. However, near the AUT's main beam, very little of the reflector leaves the quiet zone and diffraction effects from the feed and struts are not seen.

Figure 7:
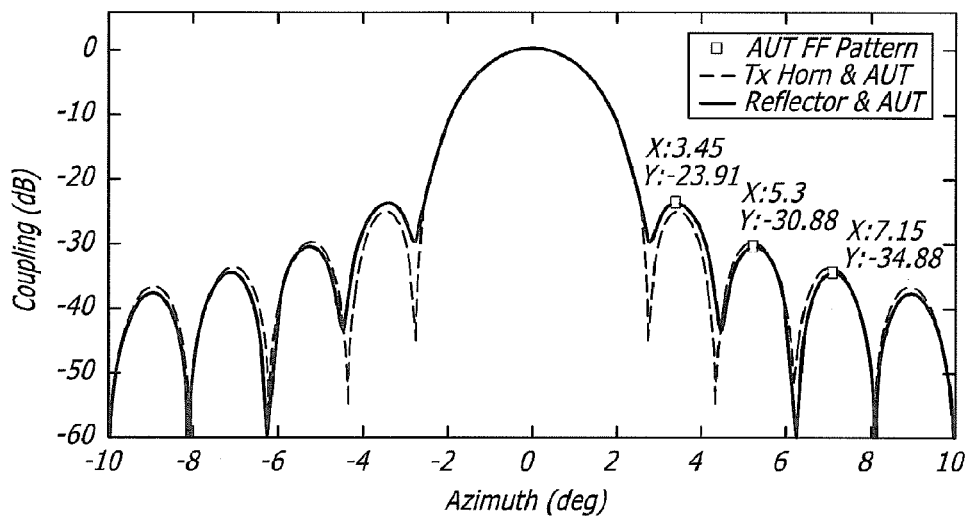
FIG. 7 is a plot that shows a comparison of antenna under test (AUT) patterns for far field conditions and a simulated quasi-compact range.

The range measurements were simulated using the antenna-coupling feature in GRASP. The test antenna and range reflector were separated 47 feet from one another and the coupling between the two was calculated. By rotating the AUT within the quiet zone and determining the coupling, the antenna pattern around the antenna was obtained as shown in FIG. 7. To ensure the simulation was performed correctly, the same coupling algorithm was used to examine the AUT on a far-field range. Both simulations were also compared to the predicted far-field pattern to analytically predict the differences in different range designs. The far-field range calculation was almost identical to the predicted pattern lending credence to the coupling calculation. The quasi-compact range simulation gave very good results around the main beam with slight filling in of the first and second nulls.

Figure 8:
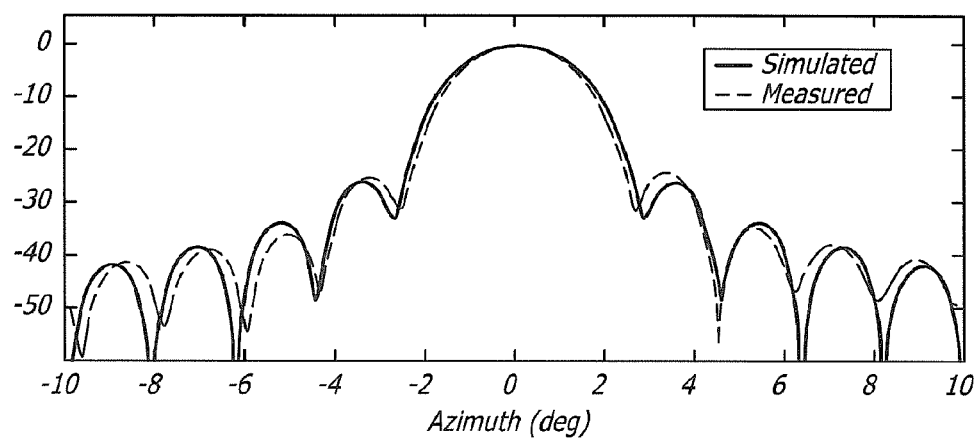
FIG. 8 is a plot that shows a comparison of a measured AUT pattern to a simulated quasi-compact range measurement.

Pattern measurements shown in FIG. 8 were also compared to the simulated range measurements and indicated the same filling in of the nulls. The dynamic range of the measurements exceeds 90 dB.

The foregoing description of the quasi-compact range technique demonstrates the technique's usefulness in extending the utility of a far-field range to measure larger test articles in the same physical space. The range's positive qualities include high dynamic range, reduced facility interactions, and low implementation cost.

Although the present invention has been described in terms of the example embodiments above, numerous modifications and/or additions to the above-described embodiments would be readily apparent to one skilled in the art. It is intended that the scope of the present invention extend to all such modifications and/or additions.

What is claimed is:

1. An antenna method comprising:
   using a reflector antenna to produce a test field within a test region at a quasi-compact range, which is within a near-field of the reflector antenna but further from an aperture plane of the reflector antenna than a compact range of the reflector antenna.

2. The antenna method of claim 1, wherein the quasi-compact range is approximately $0.16\,D^2/\lambda$, wherein D is the diameter of the reflector antenna, and $\lambda$ is the wavelength of a signal source provided to the reflector antenna.

3. The antenna method of claim 1, wherein the test field is substantially uniform within the test region.

4. The antenna method of claim 1, wherein the reflector antenna is used without edge treatments.

5. The antenna method of claim 1, wherein using a reflector antenna to produce a test field includes providing an amplitude symmetric pattern.

6. The antenna method of claim 1, further comprising:
   defocusing a feed of the reflector antenna to decrease a phase variation of the test field.

7. The antenna method of claim 1, further comprising:
   positioning an article to be measured within the test region.

8. The antenna method of claim 7, wherein the article to be measured is an antenna under test.

9. The antenna method of claim 7, wherein positioning an article to be measured includes repositioning the article within the test region.

10. An antenna method comprising:
    determining a quiet zone within a near-field of a reflector antenna and further away from the reflector antenna than a compact range of the reflector antenna in which a test field generated by the reflector antenna is substantially uniform and;

positioning a test object within the quiet zone; and using the reflector antenna to measure the test object.

11. The antenna method of claim 10, wherein determining a quiet zone includes determining a quasi-compact range which is approximately $0.16\ D^2/\lambda$, wherein D is the diameter of the reflector antenna, and $\lambda$ is the wavelength of a signal source provided to the reflector antenna.

12. The antenna method of claim 10, wherein the reflector antenna is used without edge treatments.

13. The antenna method of claim 10, wherein using the reflector antenna includes providing an amplitude symmetric pattern.

14. The antenna method of claim 10, further comprising:

defocusing a feed of the reflector antenna to decrease a phase variation of the test field.

15. An antenna system comprising:

a reflector antenna configured to generate a test field within a test region at a quasi-compact range which is within a near-field of the reflector antenna and further away from the reflector antenna than a compact range of the reflector antenna.

16. The antenna system of claim 15, wherein the quasi-compact range is approximately $0.16\ D^2/\lambda$, wherein D is the diameter of the reflector antenna, and $\lambda$ is the wavelength of a signal source provided to the reflector antenna.

17. The antenna system of claim 15, wherein the reflector antenna does not include edge treatments.

18. The antenna system of claim 15, wherein the reflector antenna includes a horn configured to generate an amplitude symmetric pattern.

19. The antenna system of claim 15, wherein a feed of the reflector antenna is defocused to decrease a phase variation of the test field.

20. The antenna system of claim 15, wherein the reflector antenna is configured such that the test field is generated to be substantially uniform within the test region, with feed blockage scattering attenuated and edge diffraction terms reduced as compared to the compact range.

21. The antenna system of claim 15, wherein the reflector antenna is configured to generate the test field such that the antenna system, due to field roll-off away from the test region, requires less test facility reflectivity performance than with a far-field pattern.

22. The antenna system of claim 15, wherein the reflector antenna is configured to generate the test field such that the antenna system has higher measurement sensitivity than with a far-field pattern.

* * * * *